United States Patent [19]
Yanagisawa et al.

[11] Patent Number: 5,500,390
[45] Date of Patent: Mar. 19, 1996

[54] METHOD FOR CONTROL OF SI CONCENTRATION IN GALLIUM PHOSPHIDE SINGLE CRYSTAL LAYER BY LIQUID PHASE EPITAXIAL GROWTH TECHNIQUE

[75] Inventors: Munehisa Yanagisawa; Yuki Tamura; Norihide Kokubu, all of Gunma, Japan

[73] Assignee: Shin-Etsu Handatoi Co., Ltd., Tokyo, Japan

[21] Appl. No.: 457,184

[22] Filed: Jun. 1, 1995

[30] Foreign Application Priority Data

Jun. 16, 1994 [JP] Japan .................................. 6-158002

[51] Int. Cl.$^6$ .................................. H01L 21/208
[52] U.S. Cl. .................. 437/120; 437/114; 437/130; 117/54; 117/67; 117/58; 117/78
[58] Field of Search ................... 117/54, 56, 58, 117/67, 78; 437/114, 120, 130; 148/DIG. 101

[56] References Cited

U.S. PATENT DOCUMENTS

| | | | |
|---|---|---|---|
| 4,492,872 | 1/1985 | Tajima | 250/459.1 |
| 4,902,356 | 2/1990 | Noguchi et al. | 437/133 |

FOREIGN PATENT DOCUMENTS

| | | |
|---|---|---|
| 0525619 | 7/1992 | European Pat. Off. . |
| 59-030797 | 2/1984 | Japan . |
| 01094247 | 4/1989 | Japan . |
| 01145398 | 6/1989 | Japan . |
| 2-18319 | 4/1990 | Japan . |
| 2006043 | 10/1978 | United Kingdom . |

*Primary Examiner*—R. Bruce Breneman
*Assistant Examiner*—Ramamohan Rao Paladugu
*Attorney, Agent, or Firm*—Lowe, Price, LeBlanc & Becker

[57] ABSTRACT

A method for controlling the Si concentration in a GaP single crystal layer grown in a series of runs of GaP liquid phase epitaxial growth with the repeated use of one and the same Ga solution, which comprise the steps of: measuring the Si concentrations of the GaP single crystal layers in preceding runs; then determining the additional Si amounts to be added into the Ga solution to refresh the Si effective concentration therein in reference to the Si concentrations in the layers; and adding Si of the thus determined amount into the Ga solution to commence the subsequent run, wherein the Si concentration in each of the GaP liquid phase epitaxial growth layers is determined from measurement of the O/G ratio in the layer, which is computed from each pair of the both values of the photoluminescent spectral peak intensity around the wavelength of 6300 Å (O component) as the numerator and the other photoluminescent spectral peak intensity around the wavelength of 5540 Å (G component) as the denominator in the photoluminescence spectrum obtained by illuminating the GaP liquid phase epitaxial growth layer with a laser beam at room temperature, with the help of good correlation therebetween.

2 Claims, 6 Drawing Sheets

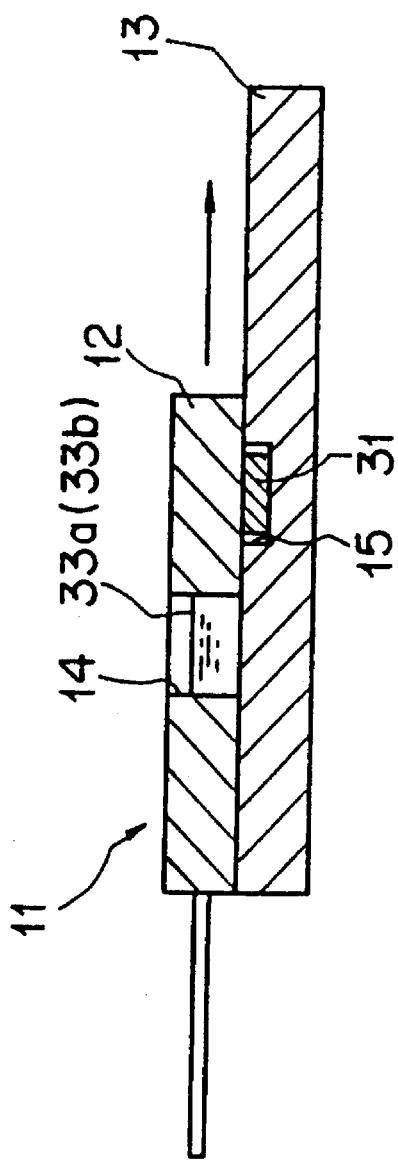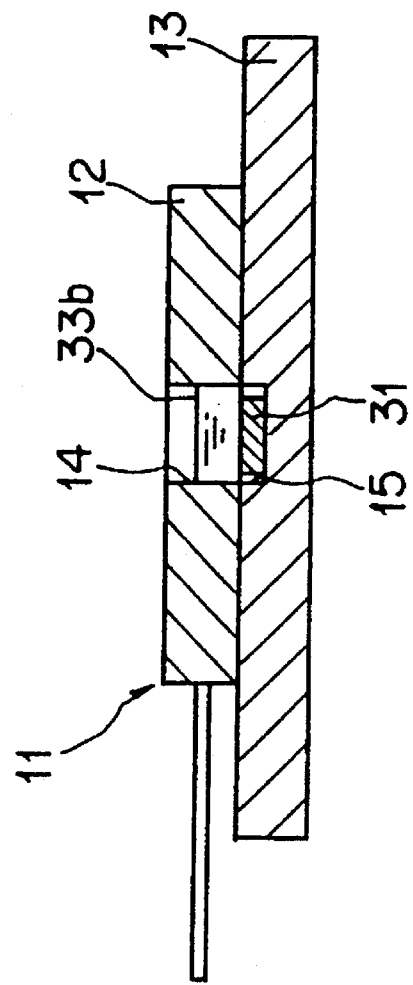
FIG. 4(a)
FIG. 4(b)

METHOD FOR CONTROL OF SI CONCENTRATION IN GALLIUM PHOSPHIDE SINGLE CRYSTAL LAYER BY LIQUID PHASE EPITAXIAL GROWTH TECHNIQUE

BACKGROUND OF THE INVENTION

1. Field of the Invention

The present invention relates to a method for controlling the concentration of Si doped slightly in a Gap single crystal layer which is grown by means of the liquid phase epitaxial growth technique (hereinafter for short referred to as GaP liquid phase epitaxial growth layer, GaP single crystal layer or GaP layer) and, more particularly, relates to a method for controlling the very low Si impurity concentration to be a desired value with the help of an analytical method for determining simply the Si concentration by a photoluminescence spectroscopic analysis at room temperature.

2. Description of the Prior Art

Light emitting devices such as light emitting diodes and the like are generally obtained by forming a plurality of semiconductor layers an a semiconductor substrate to prepare a multi-layered semiconductor substrate having pn junction and then making it into devices for the practical use. Among the devices, Green light emitting diodes can be obtained by using a light emitting device substrate prepared by forming one or more layers of n-type GaP single crystal or of p-type GaP single crystal in succession on an n-type GaP single crystal base substrate.

Since GaP is an indirect semiconductor, the light emitting output of the device made from GaP is extremely low only with pn junction formed therein. Nitrogen (N), which functions as light emitting centers, is incorporated to a n-type GaP single crystal layer in the vicinity of the pn junction in order to enhance the green light emission. The light emitting diode fabricating from the GaP light emitting device substrate which has the Nitrogen-doped n-type GaP single crystal layer as described above, emits a yellowish-green light with the peak at a wave length of about 567 nm.

FIG. 1 shows an example of the cross-sectional structure of a GaP light emitting device substrate which emits a green light. The light emitting device substrate has an n-type GaP buffer layer 2, an n-type GaP layer 3, a Nitrogen-doped n-type GaP layer 4 and a p-type GaP layer 5 grown respectively in the written order on an n-type GaP single crystal substrate 1.

A technique for sequential growth a GaP single crystal layer on a GaP single crystal substrate 1 is the liquid phase epitaxial growth technique, which, in general, is, further, classified into two techniques called as Melt-back and Non melt-back.

In the Non melt-back liquid phase epitaxial growth technique, for example, a Ga solution is prepared by dissolving GaP polycrystal in a molten Ga at 1060° C. is placed on a GaP single crystal substrate 1 and then both the solution and the GaP substrate are gradually cooled to make GaP in the Ga solution precipitate, thus a GaP single crystal layer being grown on the GaP substrate.

In the Melt-back liquid phase epitaxial growth technique, for example, after a molten Ga is placed on a GaP single crystal substrate, the temperature of them is raised to 1060° C. to prepare a Ga solution by dissolving the upper portion of the GaP substrate into the molten GaP, then both Ga solution and the GaP substrate are gradually cooled to make GaP in the Ga solution precipitate, thus a GaP single crystal layer being grown on the GaP substrate.

There has been experienced a recent great progress in technologies relating to GaP Green light emitting diodes and consequently the diodes with higher light emitting output have been developed every year. Along with this trend toward higher light emitting output, the application sphere of the GaP light emitting diode has spread to a wider range. And for the further expansion of the application sphere, development of the GaP light emitting diodes with even higher light emitting output is strongly desired.

In order to prepare a light emitting device substrate specialized for fabricating light emitting devices with higher light emitting output, a method is generally known that a multi-layered GaP substrate is prepared in advance and then the melt-back technique is applied in successive growth of a GaP single crystal layer(s) thereon, as disclosed in, for example, Japanese examined patent application HEI 2-18319.

According to this method, the multi-layered GaP substrate is previously prepared by forming an n-type GaP buffer layer(s) 2 is first grown on an n-type GaP single crystal substrate 1, and in the next stage the melt-back technique is applied to the multi-layered GaP substrate in which the upper portion of the n-type GaP buffer layer 2 thereof is dissolved in a molten Ga, then dissolved GaP dissolved in a Ga solution is inversely deposited back to form sequentially an n-type GaP layer 3, a Nitrogen-doped n-type GaP layer 4 and lastly a p-type GaP layer 5 in the written order on the multi-layered GaP substrate.

In the above mentioned technique, a trace amount of Si has been frequently incorporated into GaP liquid phase epitaxial growth layers in order to improve on crystallinity of the layers as well as an n-type dopant.

When Si is used as a dopant in the GaP liquid phase epitaxial growth, it is very difficult to stabilize the concentration of Si in GaP epitaxial layers in terms of a level due to chemical properties of Si. Especially, in practical production of GaP light emitting device substrates, the stabilization of the Si concentration becomes still worse and thereby it will be extremely difficult that a Ga solution, which is a starting stuff, is used repeatedly through a plurality of runs, which is to realize mass production together with promotion of work efficiency from the repetition of the use and to reduce the cost from material economy due to again the repetition of the use.

The Si dissolved in a Ga solution is very likely oxidized and further a growth system, designed for the above mentioned liquid phase epitaxial growth, is constructed with major parts of quartz exposed directly to the ambient gas therein, which are thought to be a serious source of Si contamination in the Ga solution during the epitaxial growth. The above mentioned conditions in the liquid phase epitaxial growth will well explain the traditional unstableness of the Si concentration in GaP single crystal layers formed by the liquid phase epitaxial growth technique.

Si is well known to have an improving effect on crystallinity of the GaP single crystal layer obtained by means of the liquid phase epitaxial growth technique and it has been understood that Si should be preferably incorporated into the above-mentioned n-type GaP buffer layer 2 in the range of $2 \times 10^{16}$ to $2 \times 10^{17}$ atoms/cm$^3$, taking into account the electric and emission characteristics of the GaP light emitting diode.

Such improving effect of Si on crystallinity is automatically makes an improving effect of Si on the emission characteristics of the GaP light emitting diode, but the advantageous use of Si doping has traditionally never been materialized in a practical liquid phase epitaxial growth of GaP single crystal layers due to the unstableness of a Si concentration. When the Si concentration in the Gap buffer layer(s) is lowered under $2 \times 10^{16}$ atoms/cm$^3$, a operating forward voltage of the light emitting diode fabricated therefrom is adversely increased due to the shortage of the carrier concentration therein. Also when the Si concentration exceeds to the contrary, that is, $2 \times 10^{17}$ atoms/cm$^3$, the light emitting output is adversely decreased.

In addition to those problems above mentioned, the traditional GaP liquid phase epitaxial growth technique has a further problem in that it was difficult simply and accurately to determine the Si concentration in a Ga solution. Therefore, in the past, there has been great demand for a method to directly determine simply the Si concentration in a Ga solution or to measure simply the Si concentration in a GaP liquid phase epitaxial growth layer.

There is known a secondary ion mass spectrometry as one of the analytical methods for evaluating trace amounts of impurities in materials with such levels thereof as of semiconductors. The secondary ion spectrometry analysis is quite an effective analytical method especially determine trace amounts of impurities in semiconductors, but it is destructive measurement in nature.

As compared with the secondary ion spectrometry analysis, a photoluminescence spectroscopic analysis provides a better technique in evaluation of a very low Si concentration in semiconductor materials without the above mentioned defect accompanying with the secondary ion spectrometry analysis. In the mean time, it has been a general understanding that the photoluminescence spectroscopic analysis requires to cool a crystal specimen for measurement down to cryogenic low temperatures, that is, the boiling temperature of liquid Nitrogen: 77K or that of liquid Helium: 4K in order to enable minute spectral structures by suppressing thermal vibration of electrons. Therefore, it has been rather an established understanding that the photoluminescence spectroscopic analysis is theoretically not allowed to be used at room temperature especially for a microanalysis of trace impurities in semiconductor materials and, as a result, almost no one has tried a practical use of the photoluminescence spectroscopic analysis at room temperature for the microanalysis of semiconductor materials.

SUMMARY OF THE INVENTION

The present invention was made in light of the above-mentioned defects of the traditional technology and it is an object thereof to provide a method for evaluating and controlling the Si concentration in a GaP liquid phase epitaxial growth layer, making it possible to control a very low concentration of Si to be a desired value with the help of an analytical method, which enable the Si concentration to be simply measured, based on a photoluminescence spectroscopic analysis at room temperature.

The method for controlling the Si concentration in a GaP single crystal layer recited in claim 1 comprises the following steps of: the Si concentration in the Si doped GaP single crystal layer grown in a preceding run is measured, in a series of runs of liquid phase epitaxial growth, where a Ga solution dissolving Si of a dopant is repeatedly used through the runs; an Si amount to be added to the Ga solution already used in the preceding run of liquid phase epitaxial growth is determined with reference to the measured value of the Si concentration and dissolved into the Ga solution; the subsequent run of liquid phase epitaxial growth is carried out with the Ga solution replenished with addition of the Si amount thus determined and, thereafter, a third and the following runs are further performed on in such a manner as above mentioned so as to have each of the Si concentrations in the GaP single crystal layers to be controlled in a desired range. In the measurement of the Si concentration in a GaP single crystal layer, a photoluminescence spectrum radiated from the GaP single crystal layer by illuminating the surface of the layer with an excitation source of a laser beam at room temperature is utilized to determine the Si concentration in the GaP single crystal layer, where the spectral peak intensity around the wavelength of 6300 Å and that around the wavelength of 5540 Å are compared with each other (hereafter the ratio of the intensity of 6300 Å to that of 5540 Å is referred to as O/G ratio) and the good correlative relation between O/G ratios and Si concentrations, which has been first found by the inventors of the present invention, is used to determine the Si concentration in a GaP single crystal layer in reference to the corresponding O/G ratio.

The method for controlling the Si concentration in a GaP single crystal layer grown in liquid phase epitaxial growth recited in claim 2 is characterized in that the Si amount to be added to the Ga solution already used in the preceding run of the liquid phase epitaxial growth is determined in reference to a correlative relation (for example, a relational table), which is prepared in advance, between the O/G ratios of the GaP single crystal layers in preceding runs of liquid phase epitaxial growth and the additional Si amounts required for one and the same Ga solution to refresh the effective Si concentration therein for the subsequent runs.

Traditionally in the measurement of the very low Si concentration in a GaP single crystal by the photoluminescence spectroscopic analysis, a specimen is cooled at the boiling points of liquid Nitrogen or liquid Helium so as to suppress thermal vibration of electrons in the crystal, thereby making it possible to clearly obtain minute spectral structure, which is natural from the principle of measurement in the photoluminescence spectroscopic analysis. What's more, in such a measurement, the concentration of an impurity is determined by the relative photoluminescent intensity as obtained by comparing a photoluminescent intensity of an extrinsic radiation peculiar to the impurity in a photoluminescence spectrum with one of the other spectral peaks in the same spectrum, whereby errors attributable to specimens being different though they are of the same kind are eliminated.

The inventors of the present invention, however, have first found a fact that, when specific spectral peaks are selected in a photoluminescence spectrum, the Si concentration in a GaP single crystal specimen may be determined in a photoluminescence spectroscopic analysis even at room temperature with such a high accuracy as to be obtained in the traditional photoluminescence spectroscopic analysis at the very low temperatures. The photoluminescence spectroscopic analysis developed by the inventors of the present invention may be performed retaining one of the distinctive features, that is, non-destructive measurement.

The construction and operation of the measuring apparatus according to this photoluminescence spectroscopic analysis at room temperature are simple as compared with those traditional apparatuses to be operated at the very low temperatures. This photoluminescence spectroscopic analysis at room temperature is, therefore, used as a very efficient in-process measuring method of Si concentration in practical processes of production for GaP light emitting device substrates.

Next there will be explained how to determine a Si concentration in GaP single crystal, which is obtained by liquid phase epitaxial growth by the above mentioned photoluminescence spectroscopis analysis at room temperature. The inventors of the present invention conducted photoluminescent measurements at room temperature on GaP liquid phase epitaxial growth layers with a variety of Si concentrations, where said GaP layers were obtained by using Ga solutions which dissolved GaP polycrystal and high purity Si with a variety of trace amounts of the latter in pure molten Ga. The details of the measurements are the same as those of the ordinary measurement except for being performed without a cryogenic cryostat for the optical use.

Photoluminescence radiated at room temperature was continuously restricted to respective specific-wavelengths by a wavelength selector to then be detected by a photomultiplier, where electric signals arose with intensities proportional to the photoluminescent intensities, and the electric signals were recorded on the graph as ordinates with the wavelengths as abscissas to complete a photoluminescence spectrum at room temperature of a Si-doped GaP liquid phase epitaxial growth layer. An example of the spectrum is shown in FIG. 2.

On the other hand, the Si concentrations of GaP liquid phase epitaxial growth layers were measured by the secondary ion mass spectrometry analysis. The Si concentrations, which unit is atoms/cm$^3$, thus obtained were each compared with the respective ratio of the spectral peak intensity around the radiation wavelength of 6300 Å (hereafter referred to as O component) to the corresponding spectral peak intensity around the wavelength of 5540 Å (hereafter referred to as G component) for each GaP layer, that is, the O/G ratios computed from the photoluminescence spectra. The results of the comparison are shown in FIG. 3.

As made clear from the graph in FIG. 3, the O/G ratio and the Si concentration have a good correlative relation therebetween. This good correlative relation means effective use of the graph for measurement of the very low Si concentration in a GaP liquid phase epitaxial growth layer.

In practical liquid epitaxial growth of GaP single crystal that is operated batchwise, where a plurality of growth batches are repeated in succession, a Ga solution with GaP and Si dissolved is efficiently used, which means cost down due to decrease in the unit consumption each of starting materials, if the both components are adjusted in concentration through batches in one and the same Ga solution repeatedly used.

A stable and simple control of the Si concentration in a GaP liquid phase epitaxial growth layer may be realized by the use of the O/G ratio in liquid phase epitaxial growth of GaP single crystal operated repeatedly batchwise in one and the same Ga solution.

That is to say, a relational table between a variety of the O/G ratios of the GaP layers in preceding runs and the additional Si amounts required for a Ga solution before liquid phase epitaxial growth runs has been prepared, and by knowing the O/G ratio of the GaP layer in a preceding run, the additional Si amount required for the Ga solution before the subsequent run can be determined referring to the relational table. Accordingly, the Si concentration in a successively grown GaP layer may be so freely controlled in a given range by regulating the Si concentration of a Ga solution before the growth based on the O/G ratio of the GaP layer in the preceding run read from the table. For instance, firstly to control the Si concentration to be in the range of $2 \times 10^{16} - 2 \times 10^{17}$ atoms/cm$^3$, the Si concentration in or Si amount to be added to the fresh Ga solution should be adjusted to be in such a range that the O/G ratio of a GaP growth layer is confined in the range of 0.01~0.030 in reference to the graph as shown in FIG. 3. Further, to adjust the Si amount to be added to the already used Ga solution for each of the second and following growths, the relational table should be effectively used depending on the first O/G ratio or each of the following ones.

According to the method for controlling the Si concentration in a GaP liquid phase epitaxial growth layer recited in claim 1, the Si concentration of the GaP layer in a preceding run is first determined from the O/G ratio measured on said GaP layer with simplicity and with ease, and thereby the additional Si amount required for a Ga solution before the subsequent epitaxial growth is adjusted, so that each of the effective Si concentrations in the Ga solution is controlled in a given range all the time through a series of runs of GaP liquid phase epitaxial growth and thus the Si concentrations in the subsequent GaP layers are respectively controlled with good accuracy.

According to the method for controlling the Si concentration in a GaP liquid phase epitaxial growth layer recited in claim 2, the O/G ratio of the GaP layer in a preceding run of the GaP liquid phase epitaxial growth is first measured, then the additional Si amount required for a Ga solution before the subsequent growth is directly determined from the O/G ratio and thereby the Si concentration in the GaP liquid phase epitaxial growth layer of the subsequent growth is easily controlled.

BRIEF DESCRIPTION OF THE DRAWINGS

The novel features which are considered characteristic of the present invention are set forth with particularity in the appended claims. The present invention itself, however, and also additional objects and advantages thereof will best be understood from the following description of embodiments thereof when read in connection with the accompanying drawings, in which:

FIGS. 4(a)–(b) are a schematic representation illustrating the GaP liquid phase epitaxial growth technique by using a slide boat;

DETAILED DESCRIPTION OF THE PREFERRED EMBODIMENT

Figure 1:
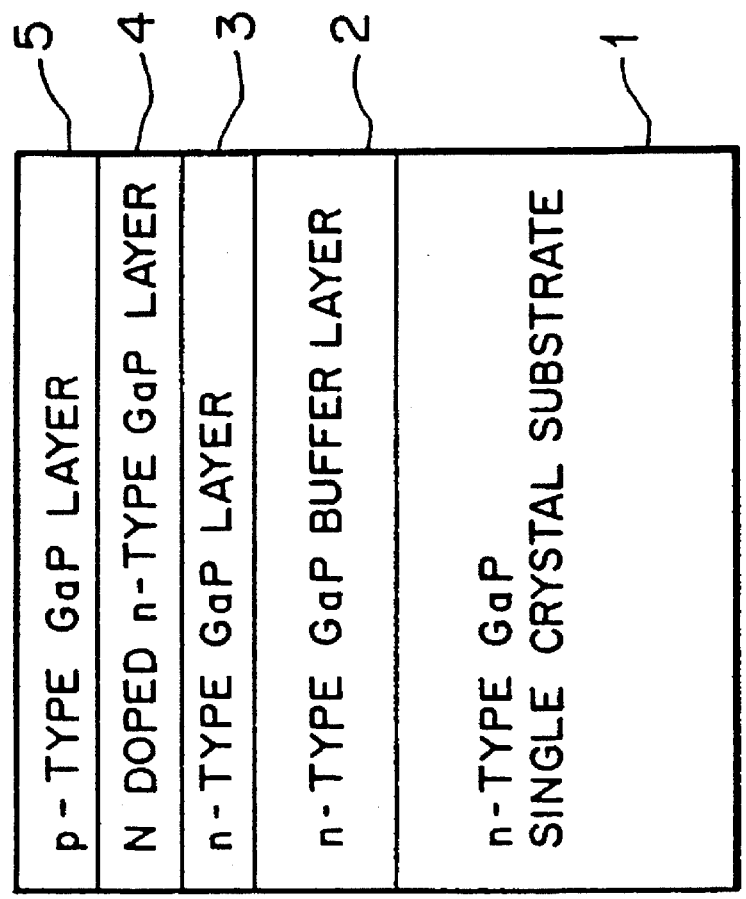
FIG. 1 is a sectional view illustrating an example of the structure of a GaP light emitting device substrate.
Figure 2:
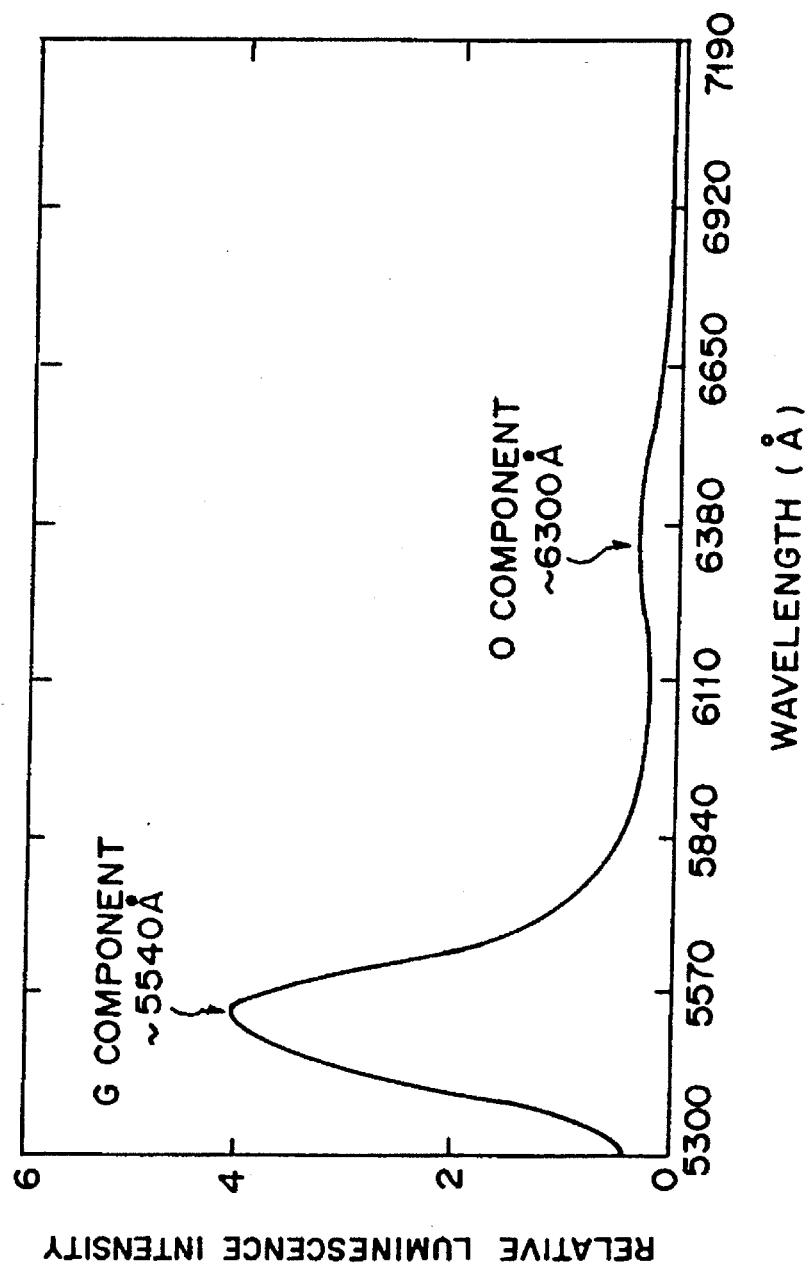
FIG. 2 is a graph of the photoluminescence spectrum at room temperature of a Si doped GaP single crystal layer grown by the liquid phase epitaxial growth technique.
Figure 3:
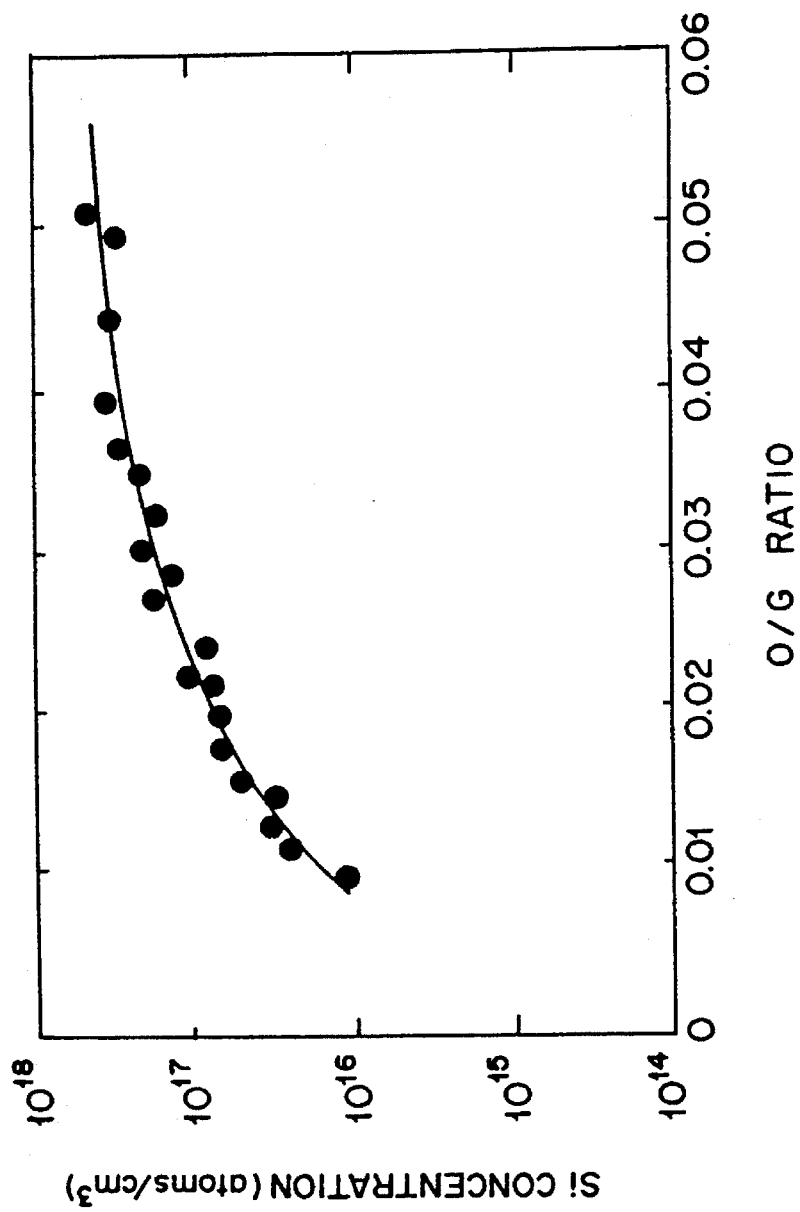
FIG. 3 is a graph showing the relation between the O/G ratios and the Si concentration measurements (atoms/cm$^3$) in GaP liquid phase epitaxial growth layers by the secondary ion mass spectrometry analysis.

Hereinafter, a preferred embodiment according to the present invention will be illustratively explained, in which growth runs of Si-doped GaP liquid phase epitaxial growth layers with a given Si concentration are successively performed in one and the same Ga solution.

In the embodiment, the epitaxial growth of a Si-doped n-type GaP single crystal layer is performed with the use of a graphite slide boat 11 shown in FIG. 4.

The process generally proceeded in the following written order: at first, a GaP single crystal base substrate 31 is placed in a recess 15 formed in the boat body 13 of a slide boat 11 and a molten Ga 33a with GaP polycrystal and Si as a dopant therein is placed in a solution reservoir 14 formed in a slide 12. Then the slider boat 11 is as a whole inserted into a growth furnace (not shown).

Pure Hydrogen gas is fed into the furnace with the slider boat already inside. Then the Ga melt 33a in the solution reservoir 14 is heated up to 1000° C. and further kept at the temperature for 90 min. in the Hydrogen ambient, in order to dissolve the GaP polycrystal and form a Ga solution saturated with GaP polycrystal, while the Si added as a dopant is uniformly dissolved at the same time in the Ga solution, so that the Ga solution 33b of 1000° C. is obtained. The heat treatment in the Hydrogen ambient is carried out on the GaP single crystal substrate 31 in parallel.

The slide 12 of the slide boat 11 is, thereafter, slid in the longitudinal direction of the boat 11 (in the direction of the arrow) as shown in FIG. 4(b) and the solution reservoir 14 is slid to be located right above the GaP single crystal base substrate 31 so as to have the Ga solution 33b contact to the GaP single crystal base substrate 31 across the surface thereof. Then, both the solution 33b and the substrate 31 are heated up to 1010° C. in no time after and kept at the temperature for 30 min. to partly melt off the surface of the GaP single crystal substrate 31, which is a melt-back step.

Figure 5:
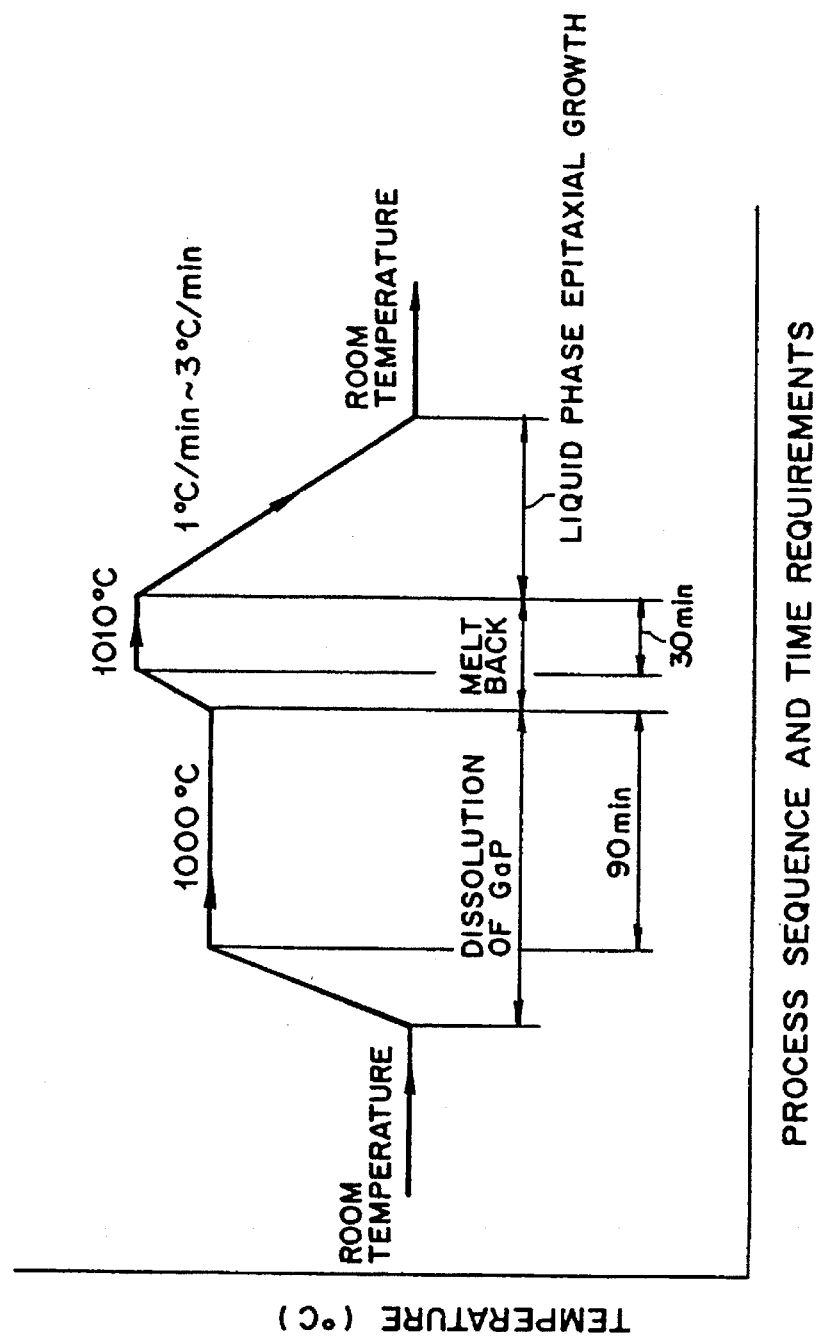
FIG. 5 is a temperature program for growing Si-doped GaP liquid phase epitaxial growth layers by the slider boat of FIG. 4 with accompanying words for explanation.

The ambient gas is changed from Hydrogen to a mixture of Hydrogen and Argon, which composition is respectively 50% to 50% by volume, at the end of the melt-back step and then the solution 33b and GaP single crystal substrate 31 are cooled at a cooling rate in the range of 1° C.–3° C./min. for a period of time to perform liquid phase epitaxial growth, thus forming a Si-doped n-type GaP liquid phase epitaxial growth layer on the GaP single crystal substrate 31. FIG. 5 shows the temperature program through the above mentioned processes and explanatory words accompanying.

After the period of time of the liquid phase epitaxial growth, the slide 12 is returned to the original position to separate the solution 33b from the substrate 31, and then the solution is cooled to room temperature. The wafer, consisting of the GaP single crystal base substrate 31 and the GaP liquid phase epitaxial growth layer formed thereon, is taken out from the inside of the growth furnace and the whole processes of liquid phase epitaxial growth is finished at this point. Another epitaxial growth may be commenced after a required amount of Si as a dopant is added to the Ga solution contained in the solution reservoir 14 together with an amount of GaP polycrystal.

The embodiment of the present invention will further be illustrated in the following description, where the Si concentrations in GaP liquid phase epitaxial growth layers are controlled to be within the range of $2 \times 10^{16} \sim 2 \times 10^{17}$ atoms/cm³, that is, the O/G ratios being controlled within the range of 0.012 to 0.030.

The relational table that shows the O/G ratios in the GaP epitaxial growth layers of preceding runs and the additional Si amounts required for a Ga solution before the subsequent epitaxial growth corresponding thereto is firstly prepared and it is used as a reference to control the Si concentrations in GaP liquid phase epitaxial growth layers in a given stable range. Table 1, which is shown here, is one example of the relational tables used for controlling the Si concentrations in the above mentioned range.

TABLE 1

| O/G ratios of GaP epitaxial growth layers in preceding runs | Additional Si amounts required for Ga solution before subsequent runs in ratio to Ga wt % |
| --- | --- |
| ~0.015 | $3.3 \times 10^{-4}$ |
| 0.015–0.020 | $2.9 \times 10^{-4}$ |
| 0.020–0.025 | $2.5 \times 10^{-4}$ |
| 0.025–0.030 | $2.2 \times 10^{-4}$ |
| 0.030~ | $1.8 \times 10^{-4}$ | where the underlined figures mean "equal to or more than" or "equal to or less than"s. The same rule also applies to Tables 2.

Using Table 1, 200 runs of liquid phase epitaxial growth of the embodiment of the present invention were performed and the resulted O/G ratios of the GaP liquid phase epitaxial layers were evaluated. The results were shown in Table 2, together with the graph in the form of the histogram of distribution thereof in FIG. 6.

TABLE 2

| Ranges of O/G Ratios & Central Values | Frequencies in % of Measured O/G Ratios Embodiment & Test | |
| --- | --- | --- |
| under 0.012 (0.010) | 1 | 4 |
| 0.012–0.015 (0.0135) | 7 | 5 |
| 0.015–0.020 (0.0175) | 22 | 15 |
| 0.020–0.025 (0.0225) | 44 | 20 |
| 0.025–0.030 (0.0275) | 23 | 18 |
| 0.030–0.035 (0.0325) | 2 | 12 |
| 0.035–0.040 (0.0375) | 1 | 9 |
| 0.040–0.045 (0.0425) | 0 | 7 |
| 0.045–0.050 (0.0475) | 0 | 4 |
| 0.050–0.055 (0.0525) | 0 | 3 |
| 0.055–0.060 (0.0575) | 0 | 2 |
| 0.060–0.065 (0.0625) | 0 | 1 |
| Sum | 100 | 100 |
| Average of O/G Ratios | 0.022 | 0.029 |
| Standard Deviation of O/G ratios | 0.0048 | 0.0116 |
| Yield | 96% | 58% | where the in-spec O/G ratios were to be in the range of 0.012 to 0.030 including the both limits, which correspond respectively to the range $2 \times 10^{16} \sim 2 \times 10^{17}$ atoms of Si/cm³, while the target O/G ratios were to be in the narrower range of 0.020 to 0.025, which correspond respectively to the range of $6 \times 10^{16} \sim 1 \times 10^{17}$ Si atoms/cm³. Each Ga solution was repeatedly used through ten runs of GaP liquid phase epitaxial growth in the embodiment.

Figure 6:
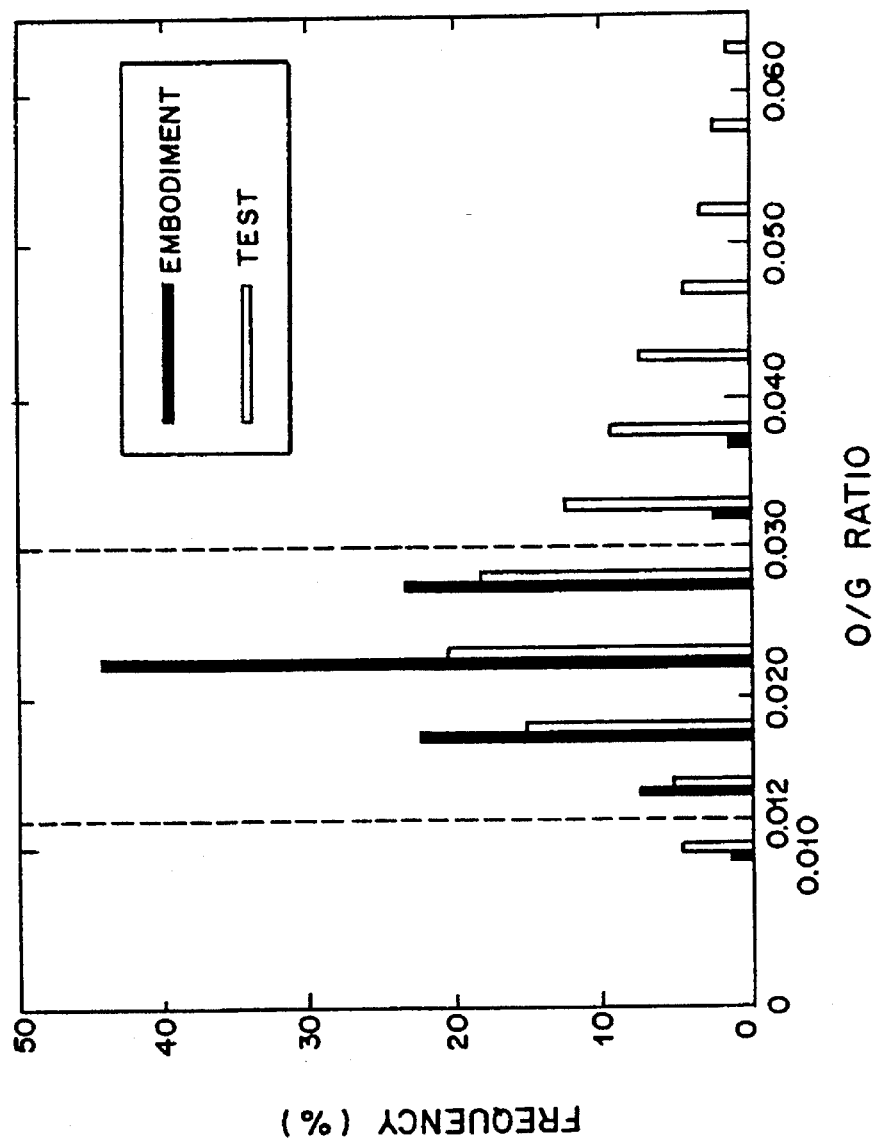
FIG. 6 is a comparative histogram showing the distributions of the results of controlled O/G ratios respectively obtained both in the embodiment of the present invention and in the test by the traditional method, described in the specification, with respect to control of the Si concentrations in GaP layers.

For comparison, test data of O/G ratios of GaP liquid phase epitaxial layers obtained by means of a traditional manner through 200 runs were shown in parallel in said table 2 and FIG. 6, wherein the first Si amount dissolved in a Ga solution was the same as that in the embodiment, and the additional Si amount after the second run in each and the same Ga solution through a series of continuous ten runs was the constant value of $2.5 \times 10^{-4}$ in the ratio to the total Ga in the solution by weight in terms of percentage, while the first Si amount dissolved was the same as that in the embodiment. In FIG. 6, the black bars mean those of the embodiment and the white ones mean the test data for comparison.

As can be seen from the Table 2 and FIG. 6, in the test of the traditional method, the standard deviation of the O/G ratios is 0.0116, which that variation in the ratios among the runs is very large and accordingly the yield of In-spec, which ratios are set in the range of 0.012–0.030, is as low as 58%. On the other hand, in the embodiment of the present invention, the O/G average ratio of 0.020, (the target values was set in the range of 0.020 to 0.025), and the standard deviation of the O/G ratios is 0.0048, which means that the O/G ratios among the runs is thoroughly controlled. Furthermore, the yield of In-spec, which ratios are set in the range of 0.012–0.030, reaches as high as 96%. This indicates that the present invention is strikingly excellent as compared with the traditional method.

As made clear in the above description, the method according to the present invention makes it possible to determine the Si concentration in a GaP single crystal with the photoluminescence spectroscopic analysis at room temperature instead of the traditional cryogenic photoluminescence spectroscopic analysis. Consequently said method for determining the Si concentration may be applied easily and simply to practical runs of GaP liquid phase epitaxial growth. Accordingly, stable control of the Si concentration in a GaP liquid phase epitaxial growth layer may be realized in practical liquid phase epitaxial growth operated repeatedly batchwise in one and the same Ga solution.

What is claimed is:

1. A method for controlling the Si concentration in a GaP single crystal layer grown in liquid phase epitaxial growth comprising the steps of: first measuring the Si concentration in the GaP single crystal layer grown in a preceding run of liquid phase epitaxial growth; determining the additional Si amount required for a Ga solution to refresh the effective Si concentration thereof with the use of the Si concentration in the preceding run as a reference, wherein one and the same Ga solution is repeatedly used during a series of runs liquid phase epitaxial growth; and thereafter in the same manner as above mentioned the additional Si amounts are successively determined during a series of the runs, characterized in that the Si concentrations in the GaP single crystal layers grown in preceding runs are measured by means of a photoluminescence spectroscopic analysis at room temperature, where each of the GaP single crystal layers is illuminated by a laser beam to excite photoluminescence; a photolumunescence spectrum is prepared based on the radiation from the layer; the spectrum is observed to determine the ratio of the photoluminescent spectral peak intensity around the wavelength of 6300 Å to the other photoluminescent spectral peak intensity around the wavelength of 5540 Å (hereafter referred to as O/G ratio); the Si concentration in the GaP liquid phase epitaxial growth layer is determined with the help of the correlation between the O/G ratio of a GaP layer and the Si concentration therein.

2. The method for controlling the Si concentration in a GaP single crystal layer grown in liquid phase epitaxial growth claimed in claim 1, characterized in that the additional Si amounts are determined in reference to a relational table, which is prepared in advance, between the O/G ratio of the GaP single crystal layer in a preceding run of liquid phase epitaxial growth and the additional Si amount required for one and the same Ga solution to refresh the effective Si concentration therein.

* * * * *